United States Patent
Yamauchi

(10) Patent No.: US 8,797,114 B2
(45) Date of Patent: Aug. 5, 2014

(54) DIFFERENTIAL TRANSMISSION LINE WITH A SET RELATIONSHIP TO A GROUND CONDUCTOR AND METHOD OF MANUFACTURING

(75) Inventor: Daisuke Yamauchi, Ibaraki (JP)

(73) Assignee: Nitto Denko Corporation, Ibaraki-shi, Osaka (JP)

( * ) Notice: Subject to any disclaimer, the term of this patent is extended or adjusted under 35 U.S.C. 154(b) by 450 days.

(21) Appl. No.: 13/176,229

(22) Filed: Jul. 5, 2011

(65) Prior Publication Data

US 2012/0025924 A1    Feb. 2, 2012

(30) Foreign Application Priority Data

Jul. 30, 2010   (JP) ................................. 2010-171742

(51) Int. Cl.
*H01P 3/08* (2006.01)
*H05K 1/02* (2006.01)

(52) U.S. Cl.
CPC ................ *H05K 1/0245* (2013.01); *H01P 3/08* (2013.01)
USPC ............................................... 333/4; 333/238

(58) Field of Classification Search
CPC ................................ H01P 3/08; H05K 1/0245
USPC ................................................... 333/4, 5, 238
See application file for complete search history.

(56) References Cited

U.S. PATENT DOCUMENTS

| | | | |
|---|---|---|---|
| 2002/0100609 | A1 | 8/2002 | Ookawa et al. |
| 2007/0141757 | A1 | 6/2007 | Nomura |
| 2007/0164401 | A1 | 7/2007 | Higuchi |
| 2009/0195999 | A1 | 8/2009 | Honjo et al. |
| 2009/0260859 | A1* | 10/2009 | Pai et al. ........................ 174/254 |
| 2010/0052820 | A1* | 3/2010 | Wu et al. ........................ 333/204 |
| 2010/0231331 | A1* | 9/2010 | Toyoshima ..................... 333/238 |

FOREIGN PATENT DOCUMENTS

| | | |
|---|---|---|
| JP | 2002-222578 A | 8/2002 |
| JP | 2003-152290 A | 5/2003 |
| JP | 2004-363315 A | 12/2004 |
| JP | 2007-150000 A | 6/2007 |
| JP | 2007-173371 A | 7/2007 |
| JP | 2007-174075 A | 7/2007 |
| JP | 2009-188080 A | 8/2009 |

OTHER PUBLICATIONS

Office Action issued Aug. 20, 2013 in JP Application No. 2010-171742.

* cited by examiner

*Primary Examiner* — Benny Lee
(74) *Attorney, Agent, or Firm* — Panitch Schwarze Belisario & Nadel LLP

(57) ABSTRACT

Two transmission lines are formed adjacent to each other at spacing on an upper surface of a base insulating layer, and a ground conductor layer is formed on a lower surface of the base insulating layer. The ground conductor layer is arranged to be opposite to at least part of one transmission line and at least part of the other transmission line in a width direction of the two transmission lines. When a width of one transmission line, a width of the other transmission line, a spacing between the two transmission lines and a width of the ground conductor layer in an arbitrary cross section perpendicular to the two transmission lines are referred to as W1, W2, S, Wg, respectively, the width Wg of the ground conductor layer is set to satisfy relationship of $Wg<(W1+W2+S)$ and $S \leq 0.8\, Wg$.

5 Claims, 10 Drawing Sheets

F I G. 1 3
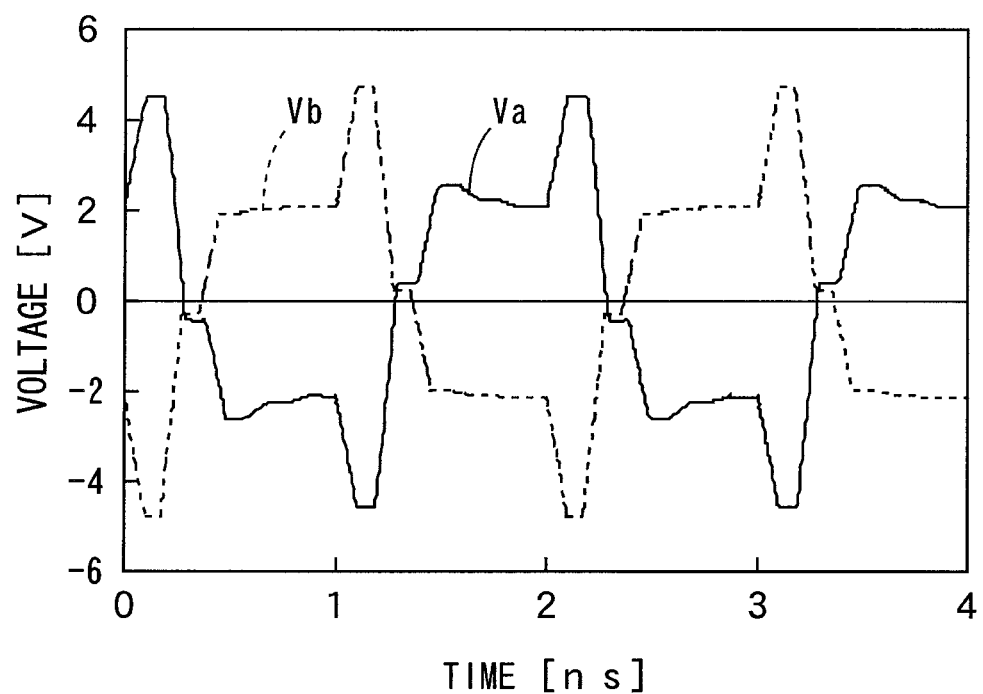

DIFFERENTIAL TRANSMISSION LINE WITH A SET RELATIONSHIP TO A GROUND CONDUCTOR AND METHOD OF MANUFACTURING

BACKGROUND OF THE INVENTION

1. Field of the Invention

The present invention relates to a printed circuit board and a method of manufacturing the same.

2. Description of the Background Art

Flexible printed circuit boards (hereinafter referred to as FPC boards) are used in electronic equipment such as communication devices and computers. Differential transmission paths for transmitting differential signals at high speed are provided on an insulating layer, for example, in the FPC board. The differential transmission path is composed of a pair of transmission lines.

The pair of transmission lines needs to have equal electrical lengths in order to prevent the differential signals transmitted through the pair of transmission lines from being distorted. The pair of transmission lines cannot be linearly formed in parallel to each other in many cases because of limitation for circuit arrangement on the FPC board. Therefore, each transmission line is provided to be curved or bent on the FPC board. In such a case, the length of each transmission line needs to be adjusted such that the pair of transmission lines has the equal electrical lengths.

In a circuit board described in JP 2007-173371 A, for example, part of each conductor line is provided with a zigzag wiring portion that is indirect and extended in order to cause the electrical lengths of a plurality of conductor lines to be equal. In such conductor lines, the indirect and extended zigzag wiring portion and other portions having linear shapes have different characteristic impedances because of difference in capacitive coupling. This results in discontinuous characteristic impedances of the transmission lines, leading to reflection and distortion of the signals.

JP 2007-173371 A describes adjustment of the width of the indirect and extended wiring portion such that the roundabout and extended wiring portion and the other portions have equal characteristic impedances.

In recent years, flexibility in dimensions of transmission lines has been restricted as the transmission lines are more densely arranged in FPC boards. This makes it difficult to precisely adjust the width of the transmission line at an arbitrary portion in its longitudinal direction to a desired value. Accordingly, continuity of the differential impedance in the differential transmission path cannot be ensured by precisely adjusting the widths of the pair of transmission lines of the differential transmission path.

BRIEF SUMMARY OF THE INVENTION

An object of the present invention is to provide a printed circuit board in which continuity of differential impedance can be ensured even when the width of a transmission line is shifted from a desired value within a given range, and a method of manufacturing the same.

(1) According to an aspect of the present invention, a printed circuit board includes a dielectric layer having one surface and the other surface, first and second transmission lines formed on the one surface of the dielectric layer and constituting a differential transmission path, and a ground conductor layer formed on the other surface of the dielectric layer, wherein the ground conductor layer is arranged to be opposite to at least part of the first transmission line and at least part of the second transmission line in a width direction of the first and second transmission lines with the dielectric layer sandwiched between the ground conductor layer and the first and second transmission lines, and a width $W1$ of the first transmission line, a width $W2$ of the second transmission line, a spacing $S$ between the first transmission line and the second transmission line, and a width $Wg$ of the ground conductor layer in an arbitrary cross section perpendicular to the first and second transmission lines satisfy relationship of $Wg<(W1+W2+S)$ and $S \leq 0.8\,Wg$.

Results of simulation performed by the inventor show that when the width $Wg$ of the ground conductor layer is not less than the total of the width $W1$ of the first transmission line, the width $W2$ of the second transmission line and the spacing $S$ between the first transmission line and the second transmission line, a ratio of change of differential impedance to change of the width $W1$ of the first transmission line and the width $W2$ of the second transmission line is increased. When the spacing $S$ between the first transmission line and the second transmission line is larger than 0.8 time the width $Wg$ of the ground conductor layer, the ratio of change of the differential impedance to change of the width $W1$ of the first transmission line and the width $W2$ of the second transmission line is increased.

Accordingly, the ratio of change of the differential impedance to change of the width $W1$ of the first transmission line and the width $W2$ of the second transmission line is decreased when in the arbitrary cross section that is perpendicular to the first and second transmission lines, the width $W1$ of the first transmission line, the width $W2$ of the second transmission line, the spacing $S$ between the first transmission line and the second transmission line, and the width $Wg$ of the ground conductor layer satisfy the relationship of the equations below:

$$Wg<(W1+W2+S)$$

$$S \leq 0.8\,Wg$$

Therefore, even when the width of each of the first and second transmission lines is shifted from the desired value within the given range, continuity of the differential impedance can be ensured by setting the width $Wg$ of the ground conductor layer in the arbitrary cross section of the differential transmission path such that the foregoing relationship is satisfied.

(2) The width $W1$ of the first transmission line, the width $W2$ of the second transmission line, the spacing $S$ between the first transmission line and the second transmission line, and the width $Wg$ of the ground conductor layer in the arbitrary cross section perpendicular to the first and second transmission lines may further satisfy relationship of $Wg/S \geq 2.00$ and $W1>2S$ and $W2>2S$ or relationship of $Wg/S<2.00$ and $W1>1.2S$ and $W2>1.2S$.

Results of simulations performed by the inventor show that when the width $Wg$ of the ground conductor layer is not less than two times the spacing $S$ between the first transmission line and the second transmission line, the ratio of change of the differential impedance to change of the width $W1$ of the first transmission line and the width $W2$ of the second transmission line is sufficiently decreased within a range where the width $W1$ of the first transmission line and the width $W2$ of the second transmission line are each larger than two times the spacing $S$.

When the width $Wg$ of the ground conductor layer is smaller than two times the spacing $S$ between the first transmission line and the second transmission line, the ratio of change of the differential impedance to change of the width W1 of the first transmission line and the width W2 of the second transmission line is sufficiently decreased within a range where the width W1 of the first transmission line and the width W2 of the second transmission line are each larger than 1.2 times the spacing S.

Accordingly, the ratio of change of the differential impedance to change of the width W1 of the first transmission line and the width W2 of the second transmission line is sufficiently decreased when in the arbitrary cross section that is perpendicular to the first and second transmission lines, the width W1 of the first transmission line, the width W2 of the second transmission line, the spacing S between the first transmission line and the second transmission line, and the width Wg of the ground conductor layer further satisfy the relationship of Wg/S≥2.00 and W1>2S and W2>2S or the relationship of Wg/S<2.00 and W1>1.2S and W2>1.2S. As a result, discontinuity of the differential impedance is sufficiently decreased.

(3) An amount of shift of a center position between respective outer side surfaces of the first and second transmission lines from a center position of the ground conductor layer in the width direction in the cross section may be smaller than half the spacing S.

The differential impedance varies according to the amount of shift of the center position between the respective outer side surfaces of the first and second transmission lines from the center position of the ground conductor layer. When the amount of shift is smaller than half the spacing S, variation of the differential impedance according to the amount of shift is small. Thus, the ground conductor layer is arranged such that its center position is located in a region between the first transmission line and the second transmission line, thereby preventing the discontinuity of the differential impedance.

(4) The amount of shift may be zero. In this case, symmetry of the differential signals transmitted through the differential transmission path is ensured.

(5) The width W1 of the first transmission line and the width W2 of the second transmission line may be equal in the width direction in the cross section.

In this case, symmetry of the differential signals transmitted through the differential transmission path can be easily ensured.

(6) According to another aspect of the present invention, a method of manufacturing a printed circuit board includes the steps of forming first and second transmission lines constituting a differential transmission path on one surface of a dielectric layer, forming a ground conductor layer on the other surface of the dielectric layer such that the ground conductor layer is opposite to at least part of the first transmission line and at least part of the second transmission line in a width direction of the first and second transmission lines with the dielectric layer sandwiched between the ground conductor layer and the first and second transmission lines, wherein a width W1 of the first transmission line, a width W2 of the second transmission line, a spacing S between the first transmission line and the second transmission line, and a width Wg of the ground conductor layer in an arbitrary cross section perpendicular to the first and second transmission lines satisfy relationship of Wg<(W1+W2+S) and S≤0.8 Wg.

In the method of manufacturing the printed circuit board, the first and second transmission lines constituting the differential transmission path are formed on the one surface of the dielectric layer. The ground conductor layer is formed on the other surface of the dielectric layer to be opposite to the at least part of the first transmission line and the at least part of the second transmission line in the width direction of the first and second transmission lines with the dielectric layer sandwiched between the ground conductor layer and the first and second transmission lines.

In this case, a ratio of change of differential impedance to change of the width W1 of the first transmission line and the width W2 of the second transmission line is decreased when in the arbitrary cross section that is perpendicular to the first and second transmission lines, the width W1 of the first transmission line, the width W2 of the second transmission line, the spacing S between the first transmission line and the second transmission line, and the width Wg of the ground conductor layer satisfy the relationship of the equations below:

$$Wg<(W1+W2+S)$$

$$S\leq 0.8Wg$$

Therefore, even when the widths W1, W2 of the first and second transmission lines are each shifted from the desired value within the given range, continuity of the differential impedance can be ensured by setting the width Wg of the ground conductor layer in the arbitrary cross section of the differential transmission path such that the foregoing relationship is satisfied.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWINGS

FIG. 13 is a diagram showing voltage waveforms of signals at the ends of the transmission lines when the amount of shift is 15 µm.

DETAILED DESCRIPTION OF THE INVENTION

Description will be made of a printed circuit board and a method of manufacturing the same according to embodiments of the present invention with reference to the drawings. In the following paragraphs, description will be made of the configuration and manufacturing method of a flexible printed circuit board having flexibility (hereinafter referred to as an FPC board) as the printed circuit board according to the embodiments of the present invention.

(1) Configuration of the FPC Board

Figure 1:
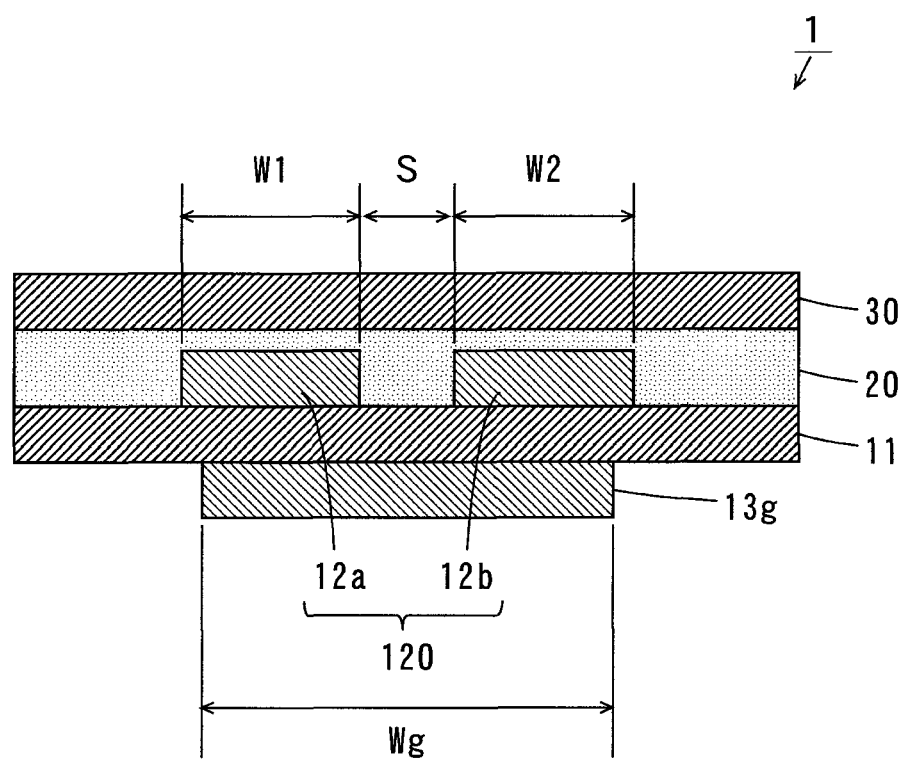
FIG. 1 is a schematic sectional view of an FPC board according to one embodiment of the present invention.

FIG. 1 is a schematic sectional view of the FPC board according to one embodiment of the present invention. As shown in FIG. 1, the FPC board 1 includes a base insulating layer 11, a pair of transmission lines 12a, 12b, a ground conductor layer 13g, an adhesive layer 20 and a cover insulating layer 30.

The pair of transmission lines 12a, 12b is formed on an upper surface of the base insulating layer 11. The pair of transmission lines 12a, 12b constitutes a differential transmission path 120 for transmitting differential signals. Terminals of electronic equipment, for example, are connected to respective beginnings and ends of the transmission lines 12a, 12b. The transmission lines 12a, 12b from beginnings to ends thereof are arranged adjacent to each other at spacing.

The adhesive layer 20 is provided on the base insulating layer 11 to cover the pair of transmission lines 12a, 12b. The cover insulating layer 30 is provided on the adhesive layer 20. The ground conductor layer 13g is formed on a lower surface of the base insulating layer 11.

The ground conductor layer 13g is arranged to be opposite to at least part of the transmission line 12a and at least part of the transmission line 12b in a width direction of the pair of transmission lines 12a, 12b with the base insulating layer 11 therebetween.

As shown in FIG. 1, in an arbitrary cross section of the FPC board 1 perpendicular to the pair of transmission lines 12a, 12b, the widths of the transmission lines 12a and 12b are referred to as W1 and W2, respectively, the spacing between the pair of transmission lines 12a, 12b is referred to as S, and the width of the ground conductor layer 13g is referred to as Wg. The width Wg of the ground conductor layer 13g is set to satisfy equations (1) and (2) shown below:

$$Wg < (W1+W2+S) \quad (1)$$

$$S \leq 0.8 Wg \quad (2)$$

The foregoing equations (1) and (2) are derived based on results of first and second simulations, described below. In the arbitrary cross section of the FPC board 1 perpendicular to the pair of transmission lines 12a, 12b, the width Wg of the ground conductor layer 13g is set to satisfy the foregoing equations (1) and (2), so that a ratio of change of differential impedance to change of the widths W1, W2 of the transmission lines 12a, 12b is decreased. As a result, even when the widths W1, W2 of the transmission lines 12a, 12b are each shifted from a desired value within a given range, continuity of the differential impedance can be ensured. Details will be described below.

When the relationship represented by the foregoing equations (1) and (2) is satisfied, each of the transmission lines 12a, 12b may have a constant width from its beginning to end, or may have different widths in a plurality of portions. The width W1 of the transmission line 12a and the width W2 of the transmission line 12b may be equal to or different from each other. When the width W1 of the transmission line 12a and the width W2 of the transmission line 12b are equal to each other, symmetry of the differential signals transmitted through the differential transmission path 120 can be easily ensured.

The width Wg of the ground conductor layer 13g, the spacing S between the transmission lines 12a, 12b and the widths W1, W2 of the transmission lines 12a, 12b are preferably set to satisfy relationship represented by equations (3), (4), (5) shown below or relationship represented by equations (6), (7), (8) shown below:

$$Wg/S \geq 2.00 \quad (3)$$

$$W1 > 2S \quad (4)$$

$$W2 > 2S \quad (5)$$

$$Wg/S < 2.00 \quad (6)$$

$$W1 > 1.2S \quad (7)$$

$$W2 > 1.2S \quad (8)$$

The foregoing equations (3) to (8) are derived based on results of the second simulation described below. In the arbitrary cross section of the FPC board 1 perpendicular to the pair of transmission lines 12a, 12b, the width Wg of the ground conductor layer 13g, the spacing S between the transmission lines 12a, 12b and the widths W1, W2 of the transmission lines 12a, 12b are set to satisfy the relationship represented by the foregoing equations (3), (4), (5) or the relationship represented by the foregoing equations (6), (7), (8), so that the ratio of change of the differential impedance to change of the widths W1, W2 of the transmission lines 12a, 12b is sufficiently decreased. As a result, even when the widths W1, W2 of the transmission lines 12a, 12b are each shifted from a desired value within a given range, discontinuity of the differential impedance is sufficiently reduced. Details will be described below.

An amount of shift of the center position of the differential transmission path 120 (the center position between respective outer side surfaces of the transmission lines 12a, 12b) from the center position of the ground conductor layer 13g in the width direction of the transmission lines 12a, 12b is preferably smaller than 0.5 time the spacing S between the transmission lines 12a, 12b.

Such a condition is satisfied, so that the continuity of the differential impedance can be ensured even when the center position of the ground conductor layer 13g is shifted from the center position of the differential transmission path 120. Details will be described below.

More preferably, the center position of the differential transmission path 120 (the center position between the respective outer side surfaces of the transmission lines 12a, 12b) coincides with the center position of the ground conductor layer 13g in the width direction of the transmission lines 12a, 12b. In this case, symmetry of the differential signals transmitted through the differential transmission path is easily ensured.

(2) The Method of Manufacturing the FPC Board

Figure 2:
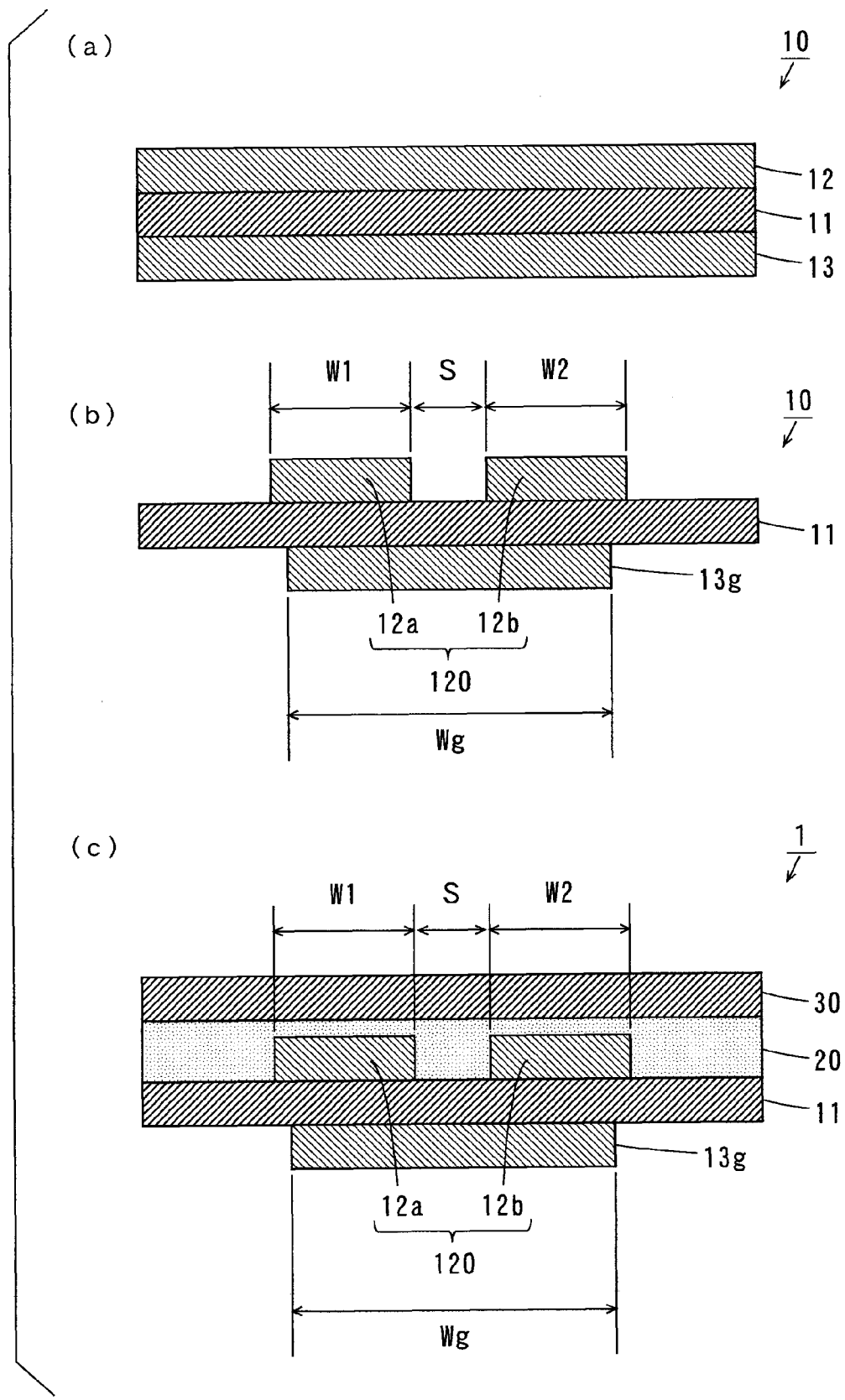
FIGS. 2 (a) to 2 (c) are schematic sectionals views for illustrating steps in one example of a method of manufacturing the FPC board of FIG. 1.

FIG. 2 shows schematic sectional views, FIGS. 2a, 2b, and 2c, for illustrating steps in one example of the method of manufacturing the FPC board 1 of FIG. 1. The FPC board 1 of FIG. 1 is formed using a subtractive method, for example.

First, a three-layer base material 10 is prepared as shown in FIG. 2 (a). The three-layer base material 10 includes a first conductor layer 12 and a second conductor layer 13 on the upper surface and the lower surface of the base insulating layer 11, respectively.

The base insulating layer 11 is made of polyimide, and the first conductor layer 12 and the second conductor layer 13 are made of copper. The thickness of the base insulating layer 11 is not less than 5 μm and not more than 100 μm, and preferably not less than 8 μm and not more than 50 μm, for example. The thickness of the first conductor layer 12 is not less than 3 μm and not more than 40 μm, and preferably not less than 8 μm and not more than 25 μm, for example. Similarly, the thickness of the second conductor layer 13 is not less than 3 μm and not more than 40 μm, and preferably not less than 8 μm and not more than 25 μm, for example.

Next, the first conductor layer 12 is subjected to patterning by undergoing normal steps of photoresist formation, exposure, development and etching, so that the pair of adjacent transmission lines 12a, 12b is formed on the upper surface of the base insulating layer 11 as shown in FIG. 2 (b). Similarly, the second conductor layer 13 of FIG. 2a is subjected to patterning by undergoing normal steps of photoresist formation, exposure, development and etching, so that the ground conductor layer 13g is formed on the lower surface of the base insulating layer 11.

The widths W1, W2 of the pair of transmission lines 12a, 12b are each not less than 20 μm and not more than 200 μm, for example. The spacing S between the pair of transmission lines 12a, 12b is not less than 8 μm and not more than 100 μm, for example. The width Wg of the ground conductor layer 13g is not less than 40 μm and not more than 300 μm, for example.

The widths W1, W2 of the pair of transmission lines 12a, 12b, the spacing S between the pair of transmission lines 12a, 12b and the width Wg of the ground conductor layer 13g are set to satisfy the foregoing equations (1) and (2) at an arbitrary position in a longitudinal direction of the pair of transmission lines 12a, 12b.

The width Wg of the ground conductor layer 13g is preferably set to satisfy the foregoing equation (3) at the arbitrary position in the longitudinal direction of the pair of transmission lines 12a, 12b. The amount of shift of the center position of the differential transmission path 120 from the center position of the ground conductor layer 13g in the width direction of the transmission lines 12a, 12b is preferably smaller than 0.5 time the spacing S between the transmission lines 12a, 12b at the arbitrary position in the longitudinal direction of the pair of transmission lines 12a, 12b. The center position of the differential transmission path 120 and the center position of the ground conductor layer 13g in the width direction of the transmission lines 12a, 12b more preferably coincide with each other.

The adhesive layer 20 is then formed on the upper surface of the base insulating layer 11 to cover upper surfaces and side surfaces of the transmission lines 12a, 12b, and the cover insulating layer 30 is laminated on the adhesive layer 20 as shown in FIG. 2 (c).

The cover insulating layer 30 is made of polyimide. The thickness of the cover insulating layer 30 is not less than 3 μm and not more than 100 μm, and preferably not less than 5 μm and not more than 60 μm, for example. An epoxy adhesive is used as the adhesive layer 20. The thickness of the adhesive layer 20 is not less than 10 μm and not more than 40 μm, for example.

In this manner, the FPC board 1 is completed. Epoxy instead of polyimide may be used as the material for the base insulating layer 11 and the cover insulating layer 30. Another dielectric material can be used as the material for the base insulating layer 11.

Another metal such as gold, nickel or aluminum or an alloy such as a copper alloy, solder or an aluminum alloy instead of copper may be used as the material for the first conductor layer 12 of FIG. 2a (transmission lines 12a, 12b). Another metal such as stainless steel, gold, nickel or aluminum or an alloy such as a copper alloy, solder or an aluminum alloy instead of copper may be used as the second conductor layer 13 of FIG. 2a (ground conductor layer 13g).

A phenolic adhesive, a polyester adhesive, an acrylic adhesive or an adhesive made of acrylonitrile butadiene rubber, for example, instead of the epoxy adhesive may be used as the adhesive layer 20.

While the transmission lines 12a, 12b are formed on the upper surface of the base insulating layer 11 and the ground conductor layer 13g of FIGS. 2b and 2c is formed on the lower surface of the base insulating layer 11 using the three-layer base material 10 in the present embodiment, the method of forming the transmission lines 12a, 12b and the ground conductor layer 13g is not limited to this. For example, the base insulating layer 11 of one layer may be prepared as a base material, and conductor layers may be formed on the upper surface and the lower surface thereof, respectively, thereby forming the pair of transmission lines 12a, 12b and the ground conductor layer 13g.

As described above, while the pair of transmission lines 12a, 12b and the ground conductor layer 13g are formed by the subtractive method on the upper surface and the lower surface of the base insulating layer 11, respectively, in the present embodiment, the present invention is not limited to this. The pair of transmission lines 12a, 12b and the ground conductor layer 13g may be formed using another method such as a semi-additive method or an additive method.

In the foregoing FPC board 1, thin metal films may be formed between the base insulating layer 11 and the pair of transmission lines 12a, 12b and between the base insulating layer 11 and the ground conductor layer 13g, respectively. In this case, adhesion between the base insulating layer 11 and the pair of transmission lines 12a, 12b, the ground conductor layer 13g is improved.

(3) Relationship between Dimensions of the Components and Transmission Characteristics of the Differential Transmission Path Here, the relationship between dimensions of the components of the FPC board 1 and transmission characteristics of the differential transmission path 120 is obtained by simulations. Note that the widths W1, W2 of the transmission lines 12a, 12b from end to end are set equal and constant in the following simulations. The thickness of each of the transmission lines 12a, 12b, the ground conductor layer 13g and the base insulating layer 11 is 18 μm. The thicknesses of the adhesive layer 20 and the cover insulating layer 30 are 18 μm and 12.5 μm, respectively.

In the first and second simulations, the center position of the differential transmission path 120 (the center position between the respective outer side surfaces of the transmission lines 12a, 12b) and the center position of the ground conductor layer 13g coincide with each other in the width direction of the transmission lines 12a, 12b in each of a plurality of FPC boards 1.

(3-1) The First Simulation

In the first simulation, relationship between the widths W1, W2 of the transmission lines 12a, 12b and the differential impedance Zdiff is obtained for each of the plurality of FPC boards 1 having different widths Wg of the ground conductor layers 13g.

Specifically, the relationship between the widths W1, W2 of the transmission lines 12a, 12b and the differential impedance Zdiff is obtained for each of the FPC boards 1 in which the ground conductor layers 13g have the widths Wg of 150 μm, 200 μm, 250 μm, 300 μm and 350 μm. The widths W1, W2 of the transmission lines 12a, 12b are each set to values from 90 μm to 200 μm. The spacing S between the pair of transmission lines 12a, 12b is kept constant at 10 μm.

The width of the base insulating layer 11 is set such that it is sufficiently larger than the maximum value of the total of the widths W1, W2 of the transmission lines 12a, 12b and the spacing S. In a reference FPC board 1, the width Wg of the ground conductor layer 13g is set equal to the width of the base insulating layer 11.

Here, in the first simulation, when change of the differential impedance Zdiff in Ω caused by change of the widths W1, W2 of the transmission lines 12a, 12b by 1 μm is not more than 0.10Ω, it can be said that the ratio of change of the differential impedance Zdiff to change of the widths W1, W2 of the transmission lines 12a, 12b is small.

Figure 3:
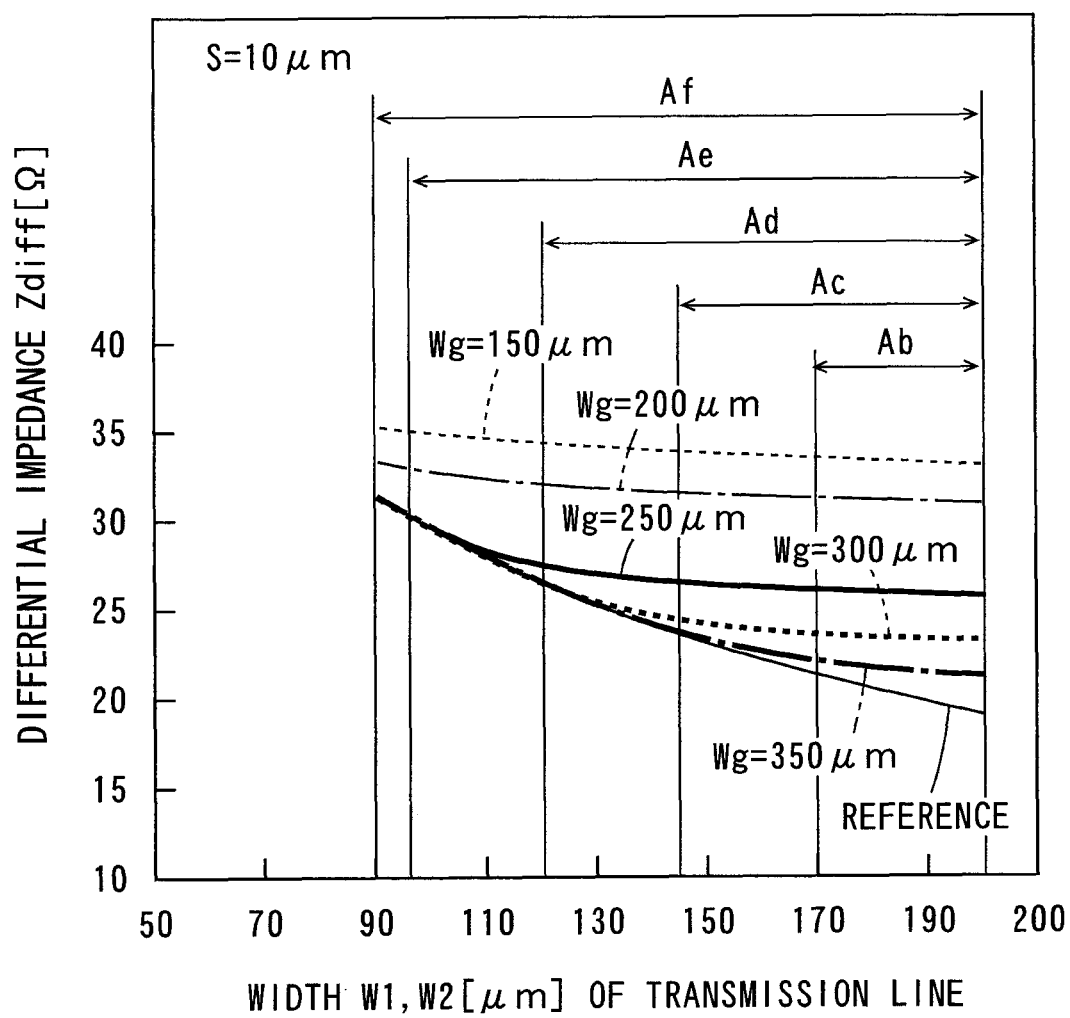
FIG. 3 is a diagram showing results of a first simulation.

FIG. 3 is a diagram showing results of the first simulation. In FIG. 3, the ordinate indicates the differential impedance Zdiff in 2 of the differential transmission path 120, and the abscissa indicates the widths, in μm, W1, W2 of the transmission lines 12a, 12b. The curve labeled REFERENCE shows the relationship for a reference FPC board 1, the width Wg of the ground conductor layer 13g is set equal to the width of the base insulating layer 11. As indicated by the label S=10 μm, the spacing S between the pair of transmission lines 12a, 12b is kept constant at 10 μm.

As shown in FIG. 3, it is found that when the ground conductor layers 13g have the different widths Wg, the ratio of change of the differential impedance Zdiff to change of the widths, in μm, W1, W2 of the transmission lines 12a, 12b is decreased in different ranges.

When the width Wg of the ground conductor layer 13g is 350 μm, the ratio of change of the differential impedance Zdiff is small in a range Ab in which the widths W1, W2 of the transmission lines 12a, 12b are each larger than 170 μm. When W1=W2=170 [μm], W1+W2+S=350 [μm]. Thus, there is almost no change in the differential impedance Zdiff when Wg<(W1+W2+S).

When the width Wg of the ground conductor layer 13g is 300 μm, the ratio of change of the differential impedance Zdiff is small in a range Ac in which the widths W1, W2 of the transmission lines 12a, 12b are each larger than 145 μm. When W1=W2=145 [μm], W1+W2+S=300 [μm]. Thus, when Wg<(W1+W2+S), there is almost no change in the differential impedance Zdiff.

When the width Wg of the ground conductor layer 13g is 250 μm, the ratio of change of the differential impedance Zdiff is small in a range Ad in which the widths W1, W2 of the transmission lines 12a, 12b are each larger than 120 μm. When W1=W2=120 [μm], W1+W2+S=250 [μm]. Thus, there is almost no change in the differential impedance Zdiff when Wg<(W1+W2+S).

When the width Wg of the ground conductor layer 13g is 200 μm, the ratio of change of the differential impedance Zdiff is small in a range Ae in which the widths W1, W2 of the transmission lines 12a, 12b are each larger than 95 μm. When W1=W2=95 [μm], W1+W2+S=200 [μm]. Thus, there is almost no change in the differential impedance Zdiff when Wg<(W1+W2+S).

When the width Wg of the ground conductor layer 13g is 150 μm, the ratio of change of the differential impedance Zdiff is small in a range Af in which the widths W1, W2 of the transmission lines 12a, 12b are each larger than 90 μm. When W1=W2=90 [μm], W1+W2+S=190 [μm]. Thus, there is almost no change in the differential impedance Zdiff when Wg<(W1+W2+S).

In the reference FPC board 1, the differential impedance Zdiff changes at a high and substantially constant rate in a range where the widths W1, W2 of the transmission lines 12a, 12b are each not less than 90 μm and not more than 200 μm.

The first simulation indicates that there is almost no change in the differential impedance Zdiff in the ranges Ab, Ac, Ad, Ae, Af in which the widths Wg of the ground conductor layers 13g each satisfy the relationship below:

$$Wg < (W1 + W2 + S) \quad (1)$$

(3-2) The Second Simulation

In the second simulation, relationship between the widths W1, W2 of the transmission lines 12a, 12b and the differential impedance Zdiff is obtained for each of a plurality of FPC boards 1 having different spacings S between the pair of transmission lines 12a, 12b and having different widths Wg of the ground conductor layers 13g.

Specifically, the relationship between the widths W1, W2 of the transmission lines 12a, 12b and the differential impedance Zdiff is obtained for each of the plurality of FPC boards 1 in which the ground conductor layers 13g each have the width Wg of 300 μm and the spacings S between the pair of transmission lines 12a, 12b are 40 μm, 80 μm, 120 μm and 150 μm.

The relationship between the widths W1, W2 of the transmission lines 12a, 12b and the differential impedance Zdiff is obtained for each of the plurality of FPC boards 1 in which the ground conductor layers 13g each have the width Wg of 250 μm and the spacings S between the pair of transmission lines 12a, 12b are 40 μm, 80 μm, 120 μm and 150 μm.

The relationship between the widths W1, W2 of the transmission lines 12a, 12b and the differential impedance Zdiff is obtained for each of the plurality of FPC boards 1 in which the ground conductor layers 13g each have the width Wg of 150 μm and the spacings S between the pair of transmission lines 12a, 12b are 40 μm, 80 μm, 120 μm and 150 μm.

The relationship between the widths W1, W2 of the transmission lines 12a, 12b and the differential impedance Zdiff is obtained for each of the plurality of FPC boards 1 in which the ground conductor layers 13g each have the width Wg of 50 μm and the spacings S between the pair of transmission lines 12a, 12b are 25 μm, 40 μm, 80 μm, 120 μm and 150 μm.

The widths W1, W2 of the transmission lines 12a, 12b are each set to values from 10 μm to 180 μm in the second simulation.

Here, in the second simulation, when the change of the differential impedance Zdiff caused by a change of the widths W1, W2 of the transmission lines 12a, 12b by 1 μm is not more than 0.10Ω, it can be said that the ratio of change of the differential impedance Zdiff to the change of the widths W1, W2 of the transmission lines 12a, 12b is small.

FIGS. 4 to 7 are diagrams showing results of the second simulation. In FIGS. 4 to 7, the ordinate indicates the differential impedance Zdiff in Ω of the differential transmission path 120, and the abscissa indicates the widths W1, W2, in μm, of the transmission lines 12a, 12b.

Figure 4:
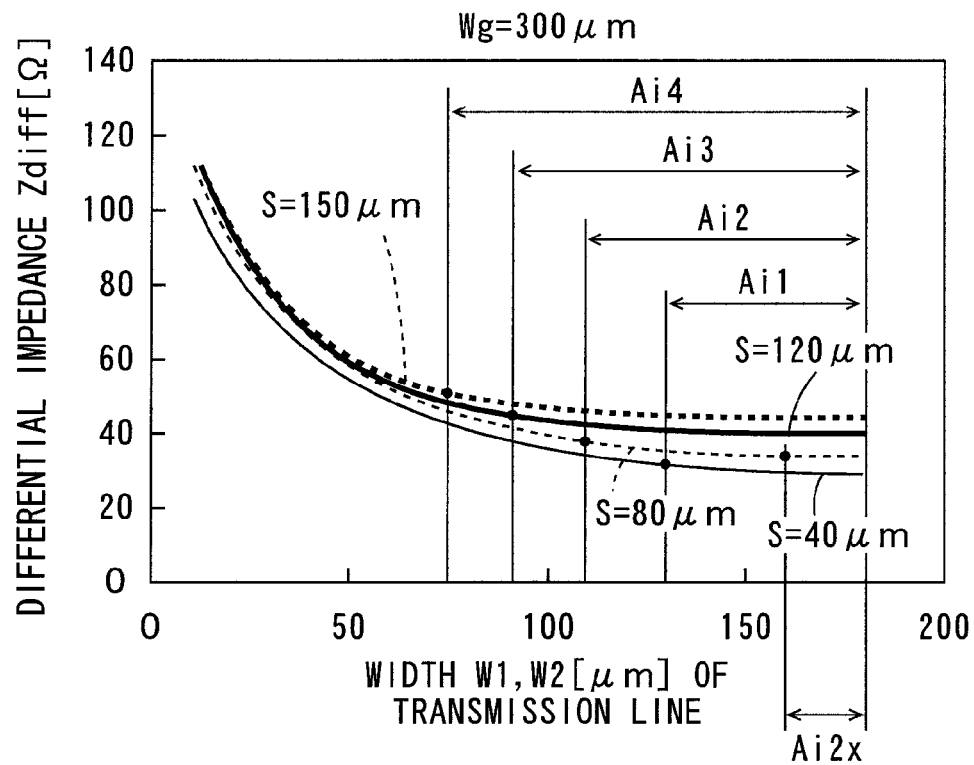
FIG. 4 is a diagram showing results of a second simulation.

As shown in FIG. 4, when the width Wg of the ground conductor layer 13g is 300 μm and the spacing S between the transmission lines 12a, 12b is 40 μm, the ratio of change of the differential impedance Zdiff is small in a range Ai1 in which the widths W1, W2 of the transmission lines 12a, 12b are each larger than 130 μm. In this case, S=0.13 Wg.

When the width Wg of the ground conductor layer 13g is 300 μm and the spacing S between the transmission lines 12a, 12b is 80 μm, the ratio of change of the differential impedance Zdiff is small in a range Ai2 in which the widths W1, W2 of the transmission lines 12a, 12b are each larger than 110 μm. In this case, S=0.27 Wg.

When the width Wg of the ground conductor layer 13g is 300 μm and the spacing S between the transmission lines 12a, 12b is 120 μm, the ratio of change of the differential impedance Zdiff is small in a range Ai3 in which the widths W1, W2 of the transmission lines 12a, 12b are each larger than 90 μm. In this case, S=0.40 Wg.

When the width Wg of the ground conductor layer 13g is 300 μm and the spacing S between the transmission lines 12a, 12b is 150 μm, the ratio of change of the differential impedance Zdiff is small in a range Ai4 in which the widths W1, W2 of the transmission lines 12a, 12b are each larger than 75 μm. In this case, S=0.50 Wg.

This indicates that when S=0.13 Wg, S=0.27 Wg, S=0.40 Wg and S=0.50 Wg, there is almost no change in the differential impedance Zdiff in the ranges Ai1, Ai2, Ai3, Ai4 in which the widths Wg of the ground conductor layers 13g each satisfy the relationship of the foregoing equation (1).

Figure 5:
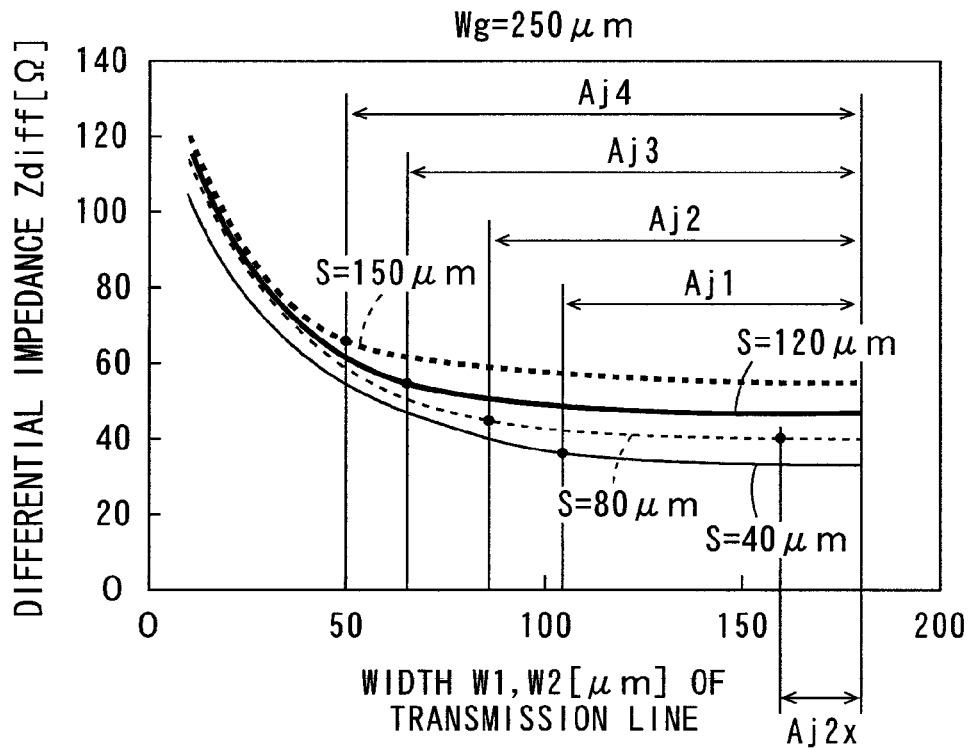
FIG. 5 is a diagram showing results of the second simulation.

As shown in FIG. 5, when the width Wg of the ground conductor layer 13g is 250 μm and the spacing S between the transmission lines 12a, 12b is 40 μm, the ratio of change of the differential impedance Zdiff is small in a range Aj1 in which the widths W1, W2 of the transmission lines 12a, 12b are each larger than 105 μm. In this case, S=0.16 Wg.

When the width Wg of the ground conductor layer 13g is 250 μm and the spacing S between the transmission lines 12a, 12b is 80 μm, the ratio of change of the differential impedance Zdiff is small in a range Aj2 in which the widths W1, W2 of the transmission lines 12a, 12b are each larger than 85 μm. In this case, S=0.32 Wg.

When the width Wg of the ground conductor layer 13g is 250 μm and the spacing S between the transmission lines 12a, 12b is 120 μm, the ratio of change of the differential impedance Zdiff is small in a range Aj3 in which the widths W1, W2 of the transmission lines 12a, 12b are each larger than 65 μm. In this case, S=0.48 Wg.

When the width Wg of the ground conductor layer 13g is 250 μm and the spacing S between the transmission lines 12a, 12b is 150 μm, the ratio of change of the differential impedance Zdiff is small in a range Aj4 in which the widths W1, W2 of the transmission lines 12a, 12b are each larger than 50 μm. In this case, S=0.60 Wg.

This indicates that when S=0.16 Wg, S=0.32 Wg, S=0.48 Wg and S=0.60 Wg, there is almost no change in the differential impedance Zdiff in the ranges Aj1, Aj2, Aj3, Aj4 in which the widths Wg of the ground conductor layers 13g each satisfy the relationship of the foregoing equation (1).

Figure 6:
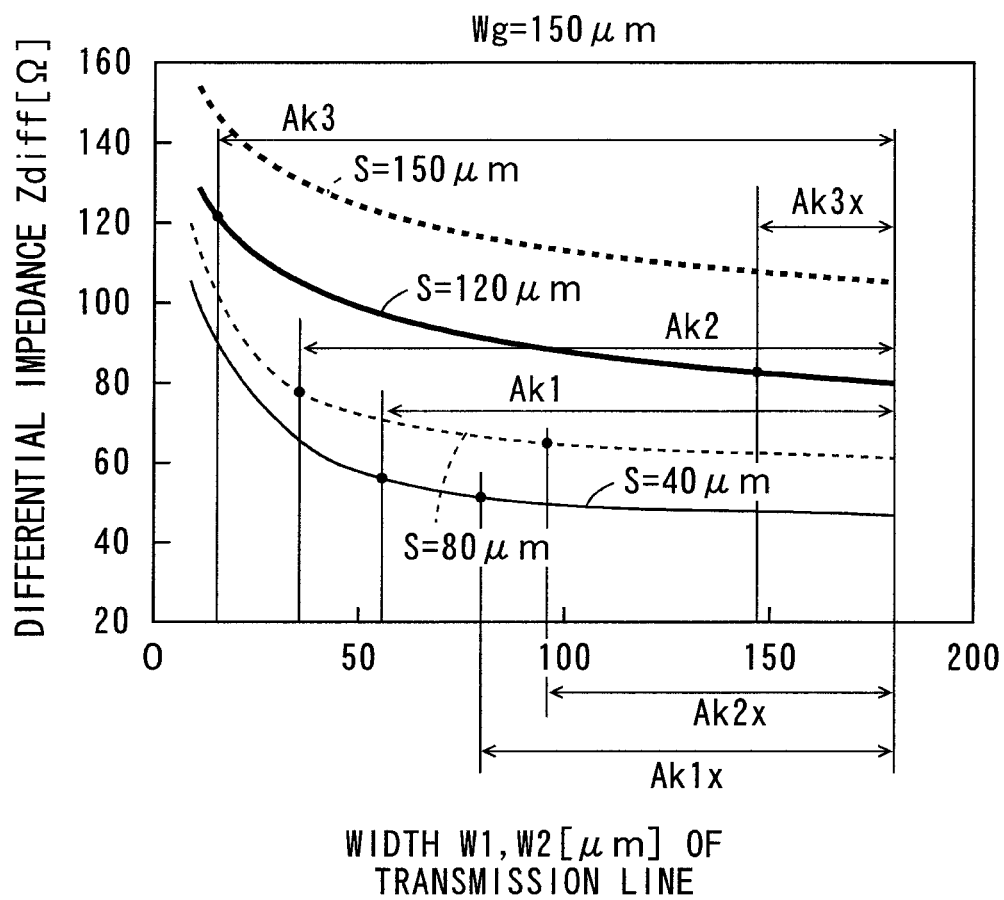
FIG. 6 is a diagram showing results of the second simulation.

As shown in FIG. 6, when the width Wg of the ground conductor layer 13g is 150 μm and the spacing S between the transmission lines 12a, 12b is 40 μm, the ratio of change of the differential impedance Zdiff is small in a range Ak1 in which the widths W1, W2 of the transmission lines 12a, 12b are each larger than 55 μm. In this case, S=0.27 Wg.

When the width Wg of the ground conductor layer 13g is 150 μm and the spacing S between the transmission lines 12a, 12b is 80 μm, the ratio of change of the differential impedance Zdiff is small in a range Ak2 in which the widths W1, W2 of the transmission lines 12a, 12b are each larger than 35 μm. In this case, S=0.53 Wg.

When the width Wg of the ground conductor layer 13g is 150 μm and the spacing S between the transmission lines 12a, 12b is 120 μm, the ratio of change of the differential impedance Zdiff is small in a range Ak3 in which the widths W1, W2 of the transmission lines 12a, 12b are each larger than 15 μm. In this case, S=0.80 Wg.

When the width Wg of the ground conductor layer 13g is 150 μm and the spacing S between the transmission lines 12a, 12b is 150 μm, the ratio of change of the differential impedance Zdiff is not decreased in any ranges. In this case, S=1.00 Wg.

This indicates that when S=0.27 Wg, S=0.53 Wg and S=0.80 Wg, there is almost no change in the differential impedance Zdiff in the ranges Ak1, Ak2, Ak3 in which the widths Wg of the ground conductor layers 13g each satisfy the relationship of the foregoing equation (1).

Meanwhile, it is found that when S=1.00 Wg, the ratio of change of the differential impedance Zdiff is increased even though the width Wg of the ground conductor layer 13g satisfies the relationship of the foregoing equation (1).

Figure 7:
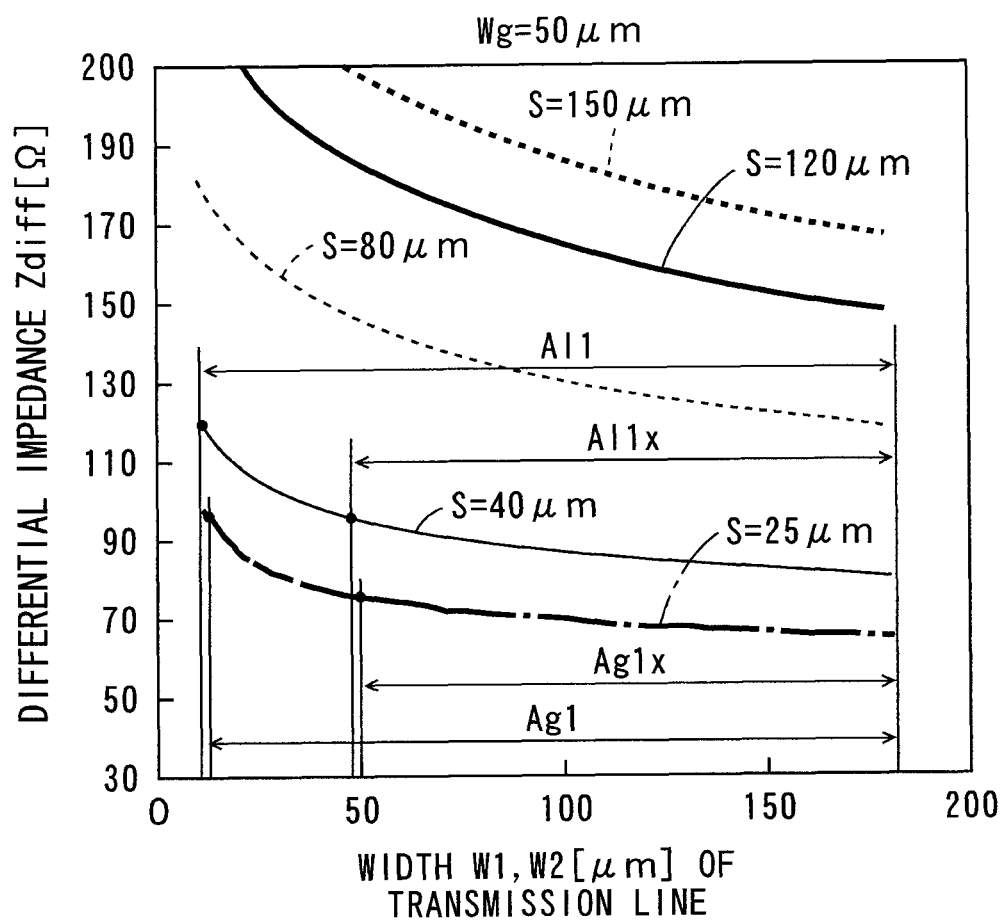
FIG. 7 is a diagram showing results of the second simulation.

As shown in FIG. 7, when the width Wg of the ground conductor layer 13g is 50 μm and the spacing S between the transmission lines 12a, 12b is 25 μm, the ratio of change of the differential impedance Zdiff is small in a range Ag1 in which the widths W1, W2 of the transmission lines 12a, 12b are each not less than 12.5 m and not more than 180 μm. In this case, S=0.5 Wg.

When the width Wg of the ground conductor layer 13g is 50 μm and the spacing S between the transmission lines 12a, 12b is 40 μm, the ratio of change of the differential impedance Zdiff is small in a range Al1 in which the widths W1, W2 of the transmission lines 12a, 12b are each not less than 10 m and not more than 180 μm. In this case, S=0.80 Wg.

When the width Wg of the ground conductor layer 13g is 50 μm and the spacing S between the transmission lines 12a, 12b is 80 μm, the ratio of change of the differential impedance Zdiff is not decreased in any ranges. In this case, S=1.60 Wg.

When the width Wg of the ground conductor layer 13g is 50 μm and the spacing S between the transmission lines 12a, 12b is 120 μm, the ratio of change of the differential impedance Zdiff is not decreased in any ranges. In this case, S=2.40 Wg.

When the width Wg of the ground conductor layer 13g is 50 μm and the spacing S between the transmission lines 12a, 12b is 150 μm, the ratio of change of the differential impedance Zdiff is not decreased in any ranges. In this case, S=3.00 Wg.

This indicates that when S=0.5 Wg and S=0.80 Wg, there is almost no change in the differential impedance Zdiff in the ranges Ag1, Al1 in which the widths Wg of the ground conductor layers 13g each satisfy the relationship of the foregoing equation (1).

Meanwhile, it is found that the ratio of change of the differential impedance Zdiff is increased when S=1.60 Wg, S=2.40 Wg and S=3.00 Wg. In this case, the widths Wg of the ground conductor layers 13g do not satisfy the relationship of the foregoing equation (1).

The results of the second simulation shown in FIGS. 4 to 7 indicate that even though the widths W1, W2 of the transmission lines 12a, 12b are changed, there is almost no change in the differential impedance Zdiff when the width Wg of the ground conductor layer 13g satisfies the foregoing equation (1) and satisfies the relationship shown below:

$$S \leq 0.8 Wg \qquad (2)$$

(3-3) Preferable Range of Dimension of Each Component
In the following description, when change of the differential impedance Zdiff caused by change of the widths W1, W2 of the transmission lines 12a, 12b by 1 μm is not more than 0.07Ω, it can be said that the ratio of change of the differential impedance Zdiff to change of the widths W1, W2 of the transmission lines 12a, 12b is sufficiently small.

As shown in FIG. 4, in the result of the second simulation, when the width Wg of the ground conductor layer 13g is 300 μm and the spacing S between the transmission lines 12a, 12b is 40 μm, the ratio of change of the differential impedance Zdiff is sufficiently small in the range Ai1 in which the widths W1, W2 of the transmission lines 12a, 12b are each larger than 130 μm. In this case, Wg/S=7.50. When W1=W2=130 [μm], W1=W2=3.25S, because S=40 [μm].

When the width Wg of the ground conductor layer 13g is 300 μm and the spacing S between the transmission lines 12a, 12b is 80 μm, the ratio of change of the differential impedance Zdiff is sufficiently small in a range Ai2x in which the widths W1, W2 of the transmission lines 12a, 12b are each larger than 160 μm. In this case, Wg/S=3.75. When W1=W2=160 [μm], W1=W2=2S, because S=80 [μm].

As shown in FIG. 5, when the width Wg of the ground conductor layer 13g is 250 μm and the spacing S between the transmission lines 12a, 12b is 40 μm, the ratio of change of the differential impedance Zdiff is sufficiently small in the range Aj1 in which the widths W1, W2 of the transmission lines 12a, 12b are each larger than 105 μm. In this case, Wg/S=6.25. When W1=W2=105 [μm], W1=W2=2.63S, because S=40 [μm].

When the range Wg of the ground conductor layer 13g is 250 μm and the spacing S between the transmission lines 12a, 12b is 80 μm, the ratio of change of the differential impedance Zdiff is sufficiently small in a range Aj2x in which the widths W1, W2 of the transmission lines 12a, 12b are each larger than 160 μm. In this case, Wg/S=3.13. When W1=W2=160 [μm], W1=W2=2S, because S=80 [μm].

As shown in FIG. 6, when the width Wg of the ground conductor layer 13g is 150 μm and the spacing S between the transmission lines 12a, 12b is 40 μm, the ratio of change of the differential impedance Zdiff is sufficiently small in a range Ak1x in which the widths W1, W2 of the transmission lines 12a, 12b are each larger than 80 μm. In this case, Wg/S=3.75. When W1=W2=80 [μm], W1=W2=2S, because S=40 [μm].

When the width Wg of the ground conductor layer 13g is 150 μm and the spacing S between the transmission lines 12a, 12b is 80 μm, the ratio of change of the differential impedance Zdiff is sufficiently small in a range Ak2x in which the widths W1, W2 of the transmission lines 12a, 12b are each larger than 96 μm. In this case, Wg/S=1.88. When W1=W2=96 [μm], W1=W2=1.2S, because S=80 [μm].

When the width Wg of the ground conductor layer 13g is 150 μm and the spacing S between the transmission lines 12a, 12b is 120 μm, the ratio of change of the differential impedance Zdiff is sufficiently small in a range Ak3x in which the widths W1, W2 of the transmission lines 12a, 12b are each larger than 144 μm. In this case, Wg/S=1.25. When W1=W2=144 [μm], W1=W2=1.2S, because S=120 [μm].

As shown in FIG. 7, when the width Wg of the ground conductor layer 13g is 50 μm and the spacing S between the transmission lines 12a, 12b is 25 μm, the ratio of change of the differential impedance Zdiff is sufficiently small in a range Ag1x in which the widths W1, W2 of the transmission lines 12a, 12b are each larger than 50 μm. In this case, Wg/S=2. When W1=W2=50 [μm], W1=W2=2S, because S=25 [μm].

When the width Wg of the ground conductor layer 13g is 50 μm and the spacing S between the transmission lines 12a, 12b is 40 μm, the ratio of change of the differential impedance Zdiff is sufficiently small in a range Al1x in which the widths W1, W2 of the transmission lines 12a, 12b are each larger than 48 μm. In this case, Wg/S=1.25. When W1=W2=[μm], W1=W2=1.2S, because S=40 [μm].

This indicates that the ratio of change of the differential impedance Zdiff is sufficiently decreased in the ranges Ai1, Ai2x, Aj1, Aj2x, Ak1x, Ag1x in which the width Wg of the ground conductor layer 13g satisfies the relationship of the foregoing equations (1) and (2) and the width Wg of the ground conductor layer 13g, the spacing S between the transmission lines 12a, 12b and the widths W1, W2 of the transmission lines 12a, 12b satisfy the relationship of the equations (3), (4), (5) shown below:

$$Wg/S > 2.00 \quad (3)$$

$$W1 > 2S \quad (4)$$

$$W2 > 2S \quad (5)$$

Moreover, it is found that the ratio of change of the differential impedance Zdiff is further decreased in the ranges Ak2x, Ak3x, Al1x in which the width Wg of the ground conductor layer 13g satisfies the relationship of the foregoing equations (1) and (2) and the width Wg of the ground conductor layer 13g, the spacing S between the transmission lines 12a, 12b and the widths W1, W2 of the transmission lines 12a, 12b satisfy the relationship of the equations (6), (7), (8) shown below:

$$Wg/S < 2.00 \quad (6)$$

$$W1 > 1.2S \quad (7)$$

$$W2 > 1.2S \quad (8)$$

Thus, in the arbitrary cross section of the differential transmission path 120, discontinuity of the differential impedance is sufficiently decreased by setting the width Wg of the ground conductor layer 13g, the spacing S between the transmission lines 12a, 12b and the widths W1, W2 of the transmission lines 12a, 12b such that the foregoing relationships are satisfied.

(3-4) Third Simulation

In a third simulation, relationship between an amount of shift of the center position of the differential transmission path 120 (the center position between the respective outer side surfaces of the transmission lines 12a, 12b) from the center position of the ground conductor layer 13g in the width direction of the transmission lines 12a, 12b and the differential impedance Zdiff is obtained.

The width Wg of the ground conductor layer 13g of the FPC board 1 is 300 μm, the widths W1, W2 of the pair of transmission lines 12a, 12b are each 150 μm, and the spacing S between the transmission lines 12a, 12b is 30 μm. In such an FPC board 1, the amount of shift D of the center position of the differential transmission path 120 from the center position of the ground conductor layer 13g in the width direction of the transmission lines 12a, 12b is set to values from 0 μm to 60 μm, and the relationship between the amount of shift D and the differential impedance Zdiff is obtained.

Figure 8:
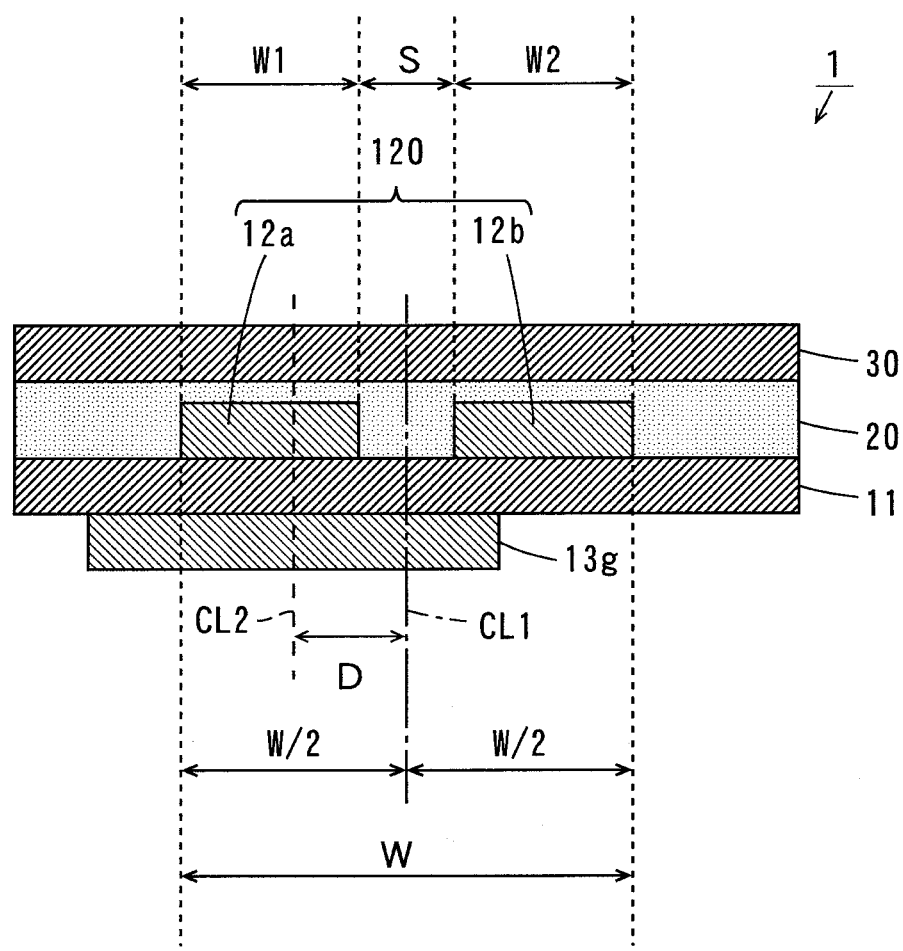
FIG. 8 is a schematic sectional view showing an amount of shift in a third simulation.

FIG. 8 is a schematic sectional view of FPC board 1 showing the amount of shift D in the third simulation. In FIG. 8, the center position CL1 of the differential transmission path 120 in the width direction of the transmission lines 12a, 12b is indicated by the one-dot and dash line, and the center position CL2 of the ground conductor layer 13g in the width direction of the transmission lines 12a, 12b is indicated by the broken line. As described above, transmission lines 12a, 12b are formed on an upper surface of the base insulating layer 11, adhesive layer 20 is provided on the base insulating layer 11 to cover the pair of transmission lines 12a, 12b, and cover insulating layer 30 is provided on the adhesive layer 20.

As shown in FIG. 8, the center position CL1 of the differential transmission path 120 in the width direction of the transmission lines 12a, 12b is located at a position of W/2, half the distance W (=W1+W2+S) between the respective outer side surfaces of the transmission lines 12a, 12b. The amount of shift D is represented by the distance between the center position CL1 and the center position CL2.

Here, in the third simulation, when change of the differential impedance Zdiff caused by change of the amount of shift D by 1 μm is not more than 0.03 SΩ, it can be said that the ratio of change of the differential impedance Zdiff to the amount of shift D is small.

Figure 9:
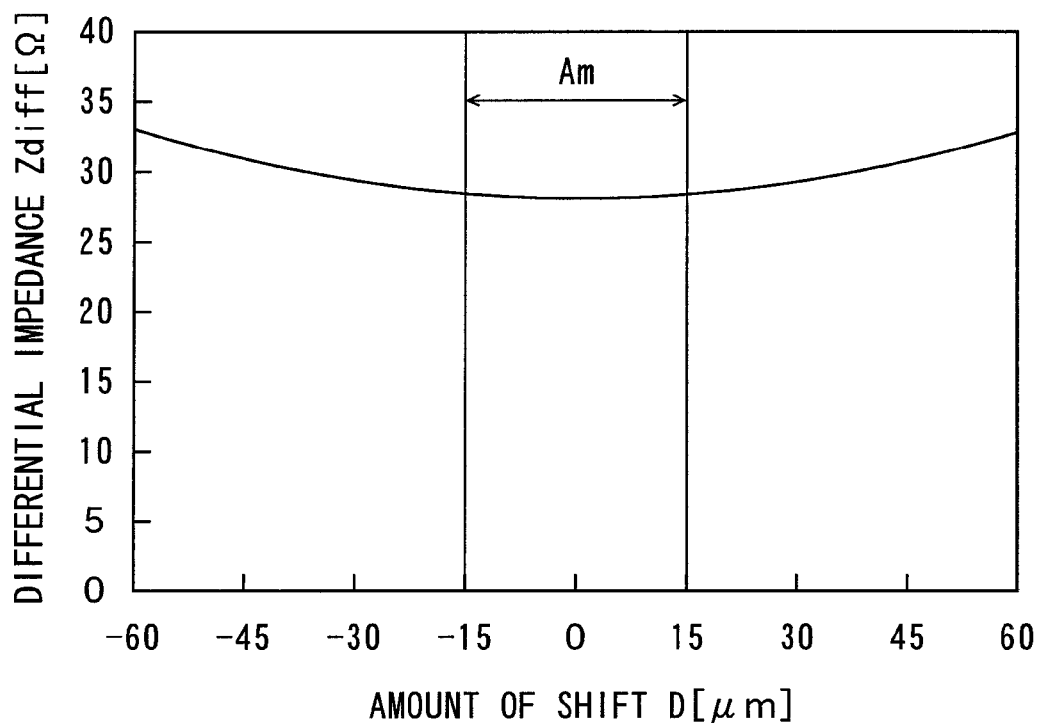
FIG. 9 is a diagram showing results of the third simulation.

FIG. 9 is a diagram showing results of the third simulation. In FIG. 9, the ordinate indicates the differential impedance Zdiff in Ω of the differential transmission path 120, and the abscissa indicates the amount of shift D in μm. In FIG. 9, with reference to FIG. 8, the center position CL1 of the differential transmission path 120, the amount of shift D when the center position CL2 of the ground conductor layer 13g is shifted to one side is represented by a positive value, and the amount of shift D when the center position CL2 is shifted to the other side is represented by a negative value.

As shown in FIG. 9, the ratio of change of the differential impedance Zdiff to the amount of shift D is small in a range Am in which an absolute value of the amount of shift D is smaller than 15 μm. Meanwhile, the ratio of change of the differential impedance Zdiff to the amount of shift D is large when the absolute value of the amount of shift D is not less than 15 μm.

As described above, the spacing S between the transmission lines 12a, 12b is 30 μm. This indicates that there is almost no change in the differential impedance Zdiff when the amount of shift D is smaller than 0.5 time the spacing S between the transmission lines 12a, 12b.

That is, continuity of the differential impedance Zdiff can be ensured in the longitudinal direction of the differential transmission path 120 as long as the center position CL1 of the differential transmission path 120 is located in a region between the transmission line 12a and the transmission line 12b, even though the center position CL1 of the differential transmission path 120 is shifted from the center position CL2 of the ground conductor layer 13g.

(3-5) Fourth Simulation

In a fourth simulation, relationship between the amount of shift D of the center position CL1 of the differential transmission path 120 from the center position CL2 of the ground conductor layer 13g in the width direction of the transmission lines 12a, 12b and waveforms of the differential signals transmitted through the differential transmission path 120 is obtained.

In the FPC board 1, the width Wg of the ground conductor layer 13g is 300 μm, the widths W1, W2 of the pair of transmission lines 12a, 12b are each 150 μm, and the spacing S between the transmission lines 12a, 12b is 30 μm. In this FPC board 1, the amount of shift D of FIG. 8 is set to 0 μm and 15 μm.

A First, an L (inductance in Henrys) parameter, a C (capacitancy in Farads) parameter and an R (resistance in Ohms) parameter of the transmission lines 12a, 12b are obtained by analyzing the foregoing FPC board 1 using an electromagnetic field simulator.

When the amount of shift D is 0 μm, the L parameter, the C parameter and the R parameter of the one transmission line 12a are $9.33 \times 10^{-8}$, $3.79 \times 10^{-10}$ and 42.292, respectively. The L parameter, the C parameter and the R parameter of the other transmission line 12b are $9.33 \times 10^{-8}$, $3.79 \times 10^{-10}$ and 42.292, respectively. As just described, the pair of transmission lines 12a, 12b have the same L parameters, C parameters and R parameters when the amount of shift D is 0 μm.

When the amount of shift D is 15 μm, the L parameter, the C parameter and the R parameter of the one transmission line 12a are $8.91 \times 10^{-8}$, $4.63 \times 10^{-10}$ and 41.9898, respectively. The L parameter, the C parameter and the R parameter of the other transmission line 12b are $9.97 \times 10^{-8}$, $3.47 \times 10^{-10}$ and 43.6655, respectively. As just described, when the amount of shift D is 15 μm, the one transmission line 12a and the other transmission line 12b have respective different L parameters, C parameters and R parameters.

Next, the differential signals in the pair of transmission lines 12a, 12b of the foregoing FPC board 1 are analyzed by a circuit simulator using the L parameters, the C parameters and the R parameters.

Figure 10:
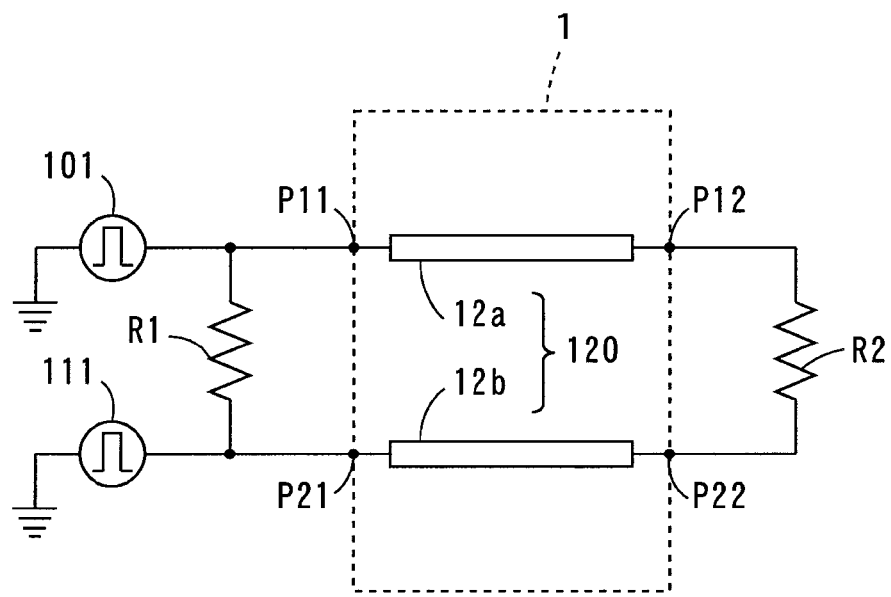
FIG. 10 is a diagram showing a simulation circuit created by a circuit simulator.

FIG. 10 is a diagram showing a simulation circuit comprising FPC board 1 created by the circuit simulator. As shown in FIG. 10, a signal generation source 101 is connected to a beginning P11 of the one transmission line 12a, and a signal generation source 111 is connected to a beginning P21 of the other transmission line 12b. A beginning resistor R1 is connected between the beginning P11 of the transmission line 12a and the beginning P21 of the transmission line 12b. An end resistor R2 is connected between an end P12 of the transmission line 12a and an end P22 of the transmission line 12b. Resistance values of the beginning resistor R1 and the end resistor R2 are each 15 SΩ.

The two signal generation sources 101, 111 generate respective rectangular signals, each of which has an inverted phase of the other.

Figure 11:
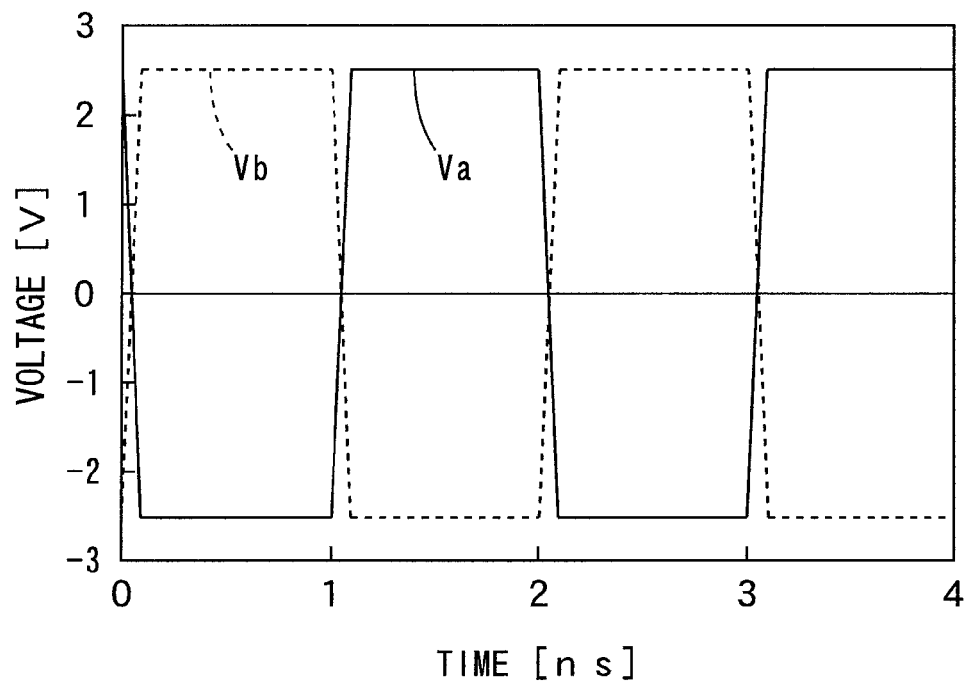
FIG. 11 is a voltage waveform diagram of signals generated by signal generation sources of FIG. 10.

FIG. 11 is a voltage waveform diagram of the signals generated by the signal generation sources 101, 111 of FIG. 10. In FIG. 11, the ordinate indicates voltage in V, and the abscissa indicates time in ns. A voltage waveform of the signal generated by the signal generation source 101 is indicated by a solid line Va, and a voltage waveform of the signal generated by the signal generation source 111 is indicated by a dotted line Vb.

The respective signals generated in the two signal generation sources 101, 111 each have a voltage of 2.5 V, a pulse width of 0.9 nsec, and a pulse period of 2.0 nsec. A rise time and a fall time of the pulse are each 0.1 nsec.

Figure 12:
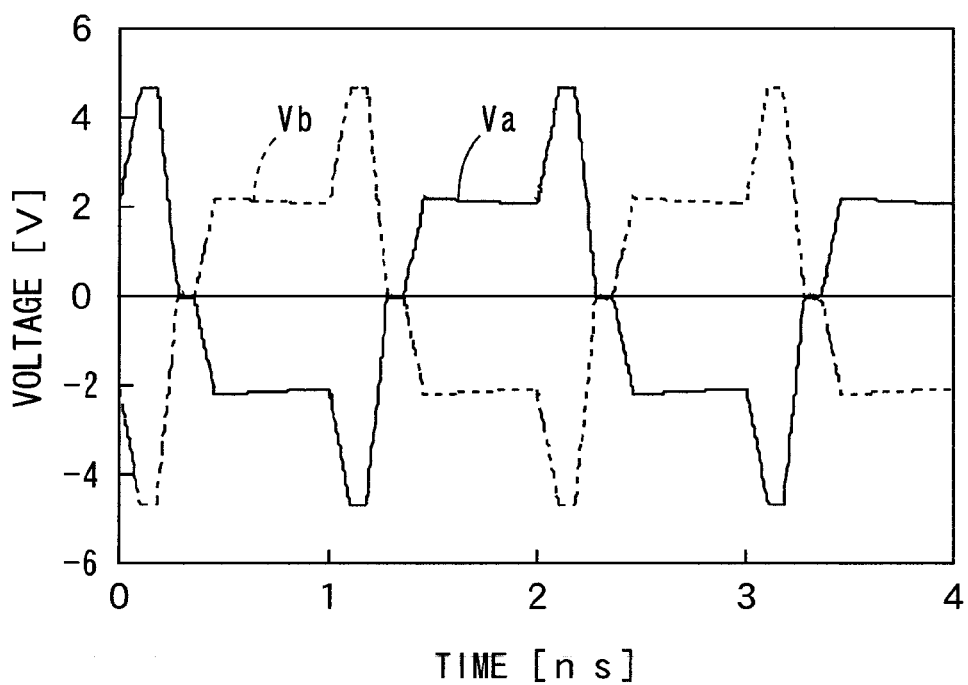
FIG. 12 is a diagram showing voltage waveforms of signals at ends of transmission lines when an amount of shift is 0 µm.

FIG. 12 is a diagram showing voltage waveforms of the signals at the ends P12, P22 of the transmission lines 12a, 12b when the amount of shift D is 0 μm. FIG. 13 is a diagram showing voltage waveforms of the signals at the ends P12, P22 of the transmission lines 12a, 12b when the amount of shift D is 15 μm. In FIGS. 12 and 13, the ordinate indicates voltage in V, and the abscissa indicates time in ns. The voltage waveform of the signal at the one end P12 is indicated by a solid line Va, and the voltage waveform of the signal at the other end P22 is indicated by a dotted line Vb.

As shown in FIG. 12, when the amount of shift D is 0 μm, the voltage waveforms of the signals at the ends P12, P22 are symmetric with respect to 0 V.

In contrast, when the amount of shift D is 15 μm, the voltage waveforms of the signals at the ends P12, P22 are asymmetric with respect to 0 V as shown in FIG. 13. In this case, distortion or noise may occur in the differential signals transmitted through the transmission lines 12a, 12b.

As a result, it is found that symmetry of the differential signals transmitted through the differential transmission path 120 is ensured by setting the position of the ground conductor layer 13g such that the amount of shift D is zero.

(4) Correspondences between Elements in the Claims and Parts in Embodiments

In the following paragraph, non-limiting examples of correspondences between various elements recited in the claims below and those described above with respect to various preferred embodiments of the present invention are explained.

In the foregoing embodiment, the base insulating layer 11 is an example of a dielectric layer, the ground conductor layer 13g is an example of a ground conductor layer, the differential transmission path 120 is an example of a differential transmission path, and the transmission lines 12a, 12b are examples of first and second transmission lines.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

I claim:

1. A printed circuit board comprising:
   a dielectric layer having a first surface and a second surface;
   first and second transmission lines formed on the one first surface of said dielectric layer and constituting a differential transmission path; and
   a ground conductor layer formed on the second surface of said dielectric layer, wherein
   said ground conductor layer is arranged to be opposite to at least part of said first transmission line and at least part of said second transmission line in a width direction of said first and second transmission lines with said dielectric layer sandwiched between said ground conductor layer and said first and second transmission lines, and
   a width W1 of said first transmission line, a width W2 of said second transmission line, a spacing S between said first transmission line and said second transmission line, and a width Wg of said ground conductor layer in an arbitrary cross section perpendicular to said first and second transmission lines satisfy a relationship of $Wg<(W1+W2+S)$ and $S\leq0.8\ Wg$, and further satisfy a relationship of $Wg/S\geq2.00$ and $W1>2S$ and $W2>2S$.

2. The printed circuit board according to claim 1, wherein the width W1 of said first transmission line and the width W2 of said second transmission line are equal in said width direction in said cross section.

3. The printed circuit board according to claim 1, wherein an amount of shift of a center position between respective outer side surfaces of said first and second transmission lines from a center position of said ground conductor layer in said width direction in said cross section is smaller than half said spacing S.

4. The printed circuit board according to claim 3, wherein said amount of shift is zero.

5. A method of manufacturing a printed circuit board comprising the steps of:
   forming first and second transmission lines constituting a differential transmission path on a first surface of a dielectric layer;
   forming a ground conductor layer on a second surface of said dielectric layer such that the ground conductor layer is opposite to at least part of said first transmission line and at least part of said second transmission line in a width direction of said first and second transmission lines with said dielectric layer sandwiched between the ground conductor layer and said first and second transmission lines; and
   setting a width W1 of said first transmission line, a width W2 of said second transmission line, a spacing S between said first transmission line and said second transmission line, and a width Wg of said ground conductor layer in an arbitrary cross section perpendicular to said first and second transmission lines to satisfy a relationship of $Wg<(W1+W2+S)$ and $S\leq0.8\ Wg$ and further satisfy a relationship of $Wg/S\geq2.00$ and $W1>2S$ and $W2<2S$.

\* \* \* \* \*